US012182612B2

(12) United States Patent
Koskinen et al.

(10) Patent No.: US 12,182,612 B2
(45) Date of Patent: Dec. 31, 2024

(54) METHOD, ARRANGEMENT, AND COMPUTER PROGRAM PRODUCT FOR ORGANIZING THE EXCITATION OF PROCESSING PATHS FOR TESTING A MICROELECTRIC CIRCUIT

(71) Applicant: MINIMA PROCESSOR OY, Oulu (FI)

(72) Inventors: Lauri Koskinen, Helsinki (FI); Navneet Gupta, Oulu (FI); Risto Anttila, Oulu (FI); Samuli Tuoriniemi, Oulu (FI)

(73) Assignee: MINIMA PROCESSOR OY, Oulu (FI)

( * ) Notice: Subject to any disclaimer, the term of this patent is extended or adjusted under 35 U.S.C. 154(b) by 88 days.

(21) Appl. No.: 17/769,979

(22) PCT Filed: Oct. 18, 2019

(86) PCT No.: PCT/FI2019/050744
§ 371 (c)(1),
(2) Date: Apr. 18, 2022

(87) PCT Pub. No.: WO2021/074484
PCT Pub. Date: Apr. 22, 2021

(65) Prior Publication Data
US 2022/0382581 A1      Dec. 1, 2022

(51) Int. Cl.
*G06F 11/22*      (2006.01)
*G01R 31/30*      (2006.01)
(Continued)

(52) U.S. Cl.
CPC ....... *G06F 9/4831* (2013.01); *G01R 31/3016* (2013.01); *G01R 31/31725* (2013.01);
(Continued)

(58) Field of Classification Search
CPC .......... G01R 31/3016; G01R 31/31725; G06F 11/0757; G06F 11/22
See application file for complete search history.

(56) References Cited

U.S. PATENT DOCUMENTS 5,185,745 A * 2/1993 Manca, Jr. ..... G01R 31/318583
714/724
5,798,938 A * 8/1998 Heikes .................... G06F 30/33
716/108
(Continued)

FOREIGN PATENT DOCUMENTS

| WO | 2018007839 | 1/2018 |
| WO | 2019097516 | 5/2019 |

OTHER PUBLICATIONS

"EPO Search Report, EP Patent Application No. 19949320.6", Jun. 9, 2023, 2 pages.
(Continued)

*Primary Examiner* — Joseph O Schell
(74) *Attorney, Agent, or Firm* — Delizio, Peacock, Lewin & Guerra LLP

(57) ABSTRACT

The excitation of processing paths in a microelectronic circuit is organized by providing one or more pieces of input information to a decision-making software, and executing the decision-making software to decide, whether one or more of said processing paths of the microelectronic circuit are to be excited with test signals. Deciding that said processing paths are to be excited with said test signals results in proceeding to excite said one or more of said processing paths with said test signals and monitoring whether timing events occur on such one or more excited processing paths. A timing event is a change in a digital value at an input of a respective register circuit on an excited processing path, which change took place later than an
(Continued)

allowable time limit defined by a triggering signal to said respective register circuit.

20 Claims, 5 Drawing Sheets

(51) Int. Cl.
  *G01R 31/317* (2006.01)
  *G06F 1/3206* (2019.01)
  *G06F 1/3296* (2019.01)
  *G06F 9/48* (2006.01)
  *G06F 11/07* (2006.01)

(52) U.S. Cl.
  CPC .......... *G06F 1/3206* (2013.01); *G06F 1/3296* (2013.01); *G06F 11/22* (2013.01); *G06F 11/0757* (2013.01)

(56) References Cited

U.S. PATENT DOCUMENTS

| | | | | |
|---|---|---|---|---|
| 6,665,758 | B1* | 12/2003 | Frazier | G06F 11/0757 710/262 |
| 7,539,900 | B1* | 5/2009 | Plofsky | G11C 29/16 714/30 |
| 7,657,807 | B1* | 2/2010 | Watkins | G01R 31/318594 714/724 |
| 9,760,672 | B1 | 9/2017 | Taneja et al. | |
| 2004/0025123 | A1* | 2/2004 | Angilivelil | G01R 31/318328 700/109 |
| 2004/0078697 | A1* | 4/2004 | Duncan | G06F 11/0772 714/E11.02 |
| 2008/0092004 | A1* | 4/2008 | Watkins | G01R 31/3016 714/738 |
| 2008/0263489 | A1 | 10/2008 | Canada et al. | |
| 2010/0299096 | A1* | 11/2010 | Ishida | G01R 31/31725 702/117 |
| 2011/0121838 | A1* | 5/2011 | Gillis | G01R 31/318544 713/601 |
| 2012/0159276 | A1 | 6/2012 | Zandian et al. | |
| 2014/0281776 | A1 | 9/2014 | Champion et al. | |
| 2015/0162097 | A1* | 6/2015 | Eckert | G06F 11/27 714/718 |
| 2017/0293541 | A1* | 10/2017 | Venu | G06F 11/22 |
| 2018/0096086 | A1* | 4/2018 | Zompakis | G06F 1/08 |
| 2019/0179403 | A1 | 6/2019 | Tajalli | |

OTHER PUBLICATIONS

"Office Action issued in related European Patent Application No. 19949320.6", Jun. 9, 2023, 6 pages.

Sartori, et al., "Software Canaries: Software-based Path Delay Fault Testing for Variation-aware Energy-effecient Design", Low Power Electronics and Design, ACM DOI: 10.1145/262369.2627646, Aug. 11, 2014, 6 pages.

"PCT Application No. PCT/FI2019/050744, International Search Report and Written Opinion", Mar. 26, 2020, 14 pages.

* cited by examiner

METHOD, ARRANGEMENT, AND COMPUTER PROGRAM PRODUCT FOR ORGANIZING THE EXCITATION OF PROCESSING PATHS FOR TESTING A MICROELECTRIC CIRCUIT

FIELD OF THE INVENTION

The invention relates generally to the technology of testing the correct operation of processing paths in a microelectronic circuit. In particular the invention relates to timing such testing so that sufficiently recent, up-to-date test results are available when needed without causing unnecessary disturbance to other functions of the microelectronic circuit.

BACKGROUND OF THE INVENTION

Processing paths in a microelectronic circuit comprise chains where register circuits come after logic units. A register circuit must store the output value of the preceding logic unit at the rising and/or falling edge of a triggering signal (if the register circuit is a flip-flop) or at a high or low level of the triggering signal (if the register circuit is a latch). Too high clock frequency and/or too low operating voltage may cause timing events in which the output value of the preceding logic unit changes too late to become properly stored.

Adaptive microelectronic circuits are capable of dynamically changing the operating voltage and/or the clock frequency to control their power consumption in relation to required performance: power consumption can be reduced by lowering the operating voltage and/or the clock frequency, if the resulting temporary degradation in maximum performance can be accepted. In order to provide the microelectronic circuit with knowledge of whether a currently used combination of operating voltage and clock frequency risks causing timing events, at least some of its processing paths must be equipped for timing event detection. Circuit solutions that enable timing event detection are discussed for example in the patent applications PCT/FI2017/050290, PCT/FI2017/050475, PCT/FI2017/050853, PCT/FI2017/050852, and PCT/FI2018/050882.

Testing the operation of a microelectronic circuit for the possible occurrence of timing events can be referred to as exciting some processing paths. The most important processing paths to be excited are the so-called critical paths on which the longest processing delays can be expected according to a delay distribution analysis. Exciting involves generating deliberate changes of digital values and allowing them to propagate through the selected processing paths, simultaneously looking for anomalies in what becomes temporarily stored in the register circuits of those processing paths. This cannot happen while those processing paths are in normal operation. Neither is the exciting for test purposes allowed to change the state of the microelectronic circuit, including register and memory values, unless the changed bits are don't-care bits in terms of the total state of the microelectronic circuit. A problem to be solved is thus how to manage the timing of processing path excitation for testing purposes.

SUMMARY

It is an objective of the invention to present a method, an arrangement, and a computer program product for organizing the excitation of processing paths in a microelectronic circuit so that they can be used to test the operation of the microelectronic circuit without interfering with the normal operation of the microelectronic circuit. A further objective is to enable organizing the testing so that it can be matched with varying needs of processing capability of different processes to be executed.

These and further advantageous objectives are achieved with the features listed in the accompanying independent claims. Advantageous embodiments of the invention are described in depending claims.

According to a first aspect there is provided a method for organizing the excitation of processing paths in a microelectronic circuit. The method comprises providing one or more pieces of input information to a decision-making software; executing the decision-making software to decide, based on at least said one or more pieces of input information, whether one or more of said processing paths of the microelectronic circuit are to be excited with test signals; and as a result of deciding that said one or more processing paths of the microelectronic circuit are to be excited with said test signals, proceeding to excite said one or more of said processing paths with said test signals and monitoring whether timing events occur on such one or more excited processing paths. A timing event is a change in a digital value at an input of a respective register circuit on an excited processing path, which change took place later than an allowable time limit defined by a triggering signal to said respective register circuit.

According to an embodiment the method comprises executing a scheduler as a part of a real-time operating system running in said microelectronic circuit; scheduling, through said executing of said scheduler, the running of a plurality of tasks in said microelectronic circuit in an order defined by priorities associated with said tasks; repetitively setting, through said executing of said scheduler, the microelectronic circuit into an idle state for idle periods between consecutive periods of running said tasks; and using said setting into an idle state as one of said one or more pieces of input information, so that during one or more of said idle periods, one or more of said processing paths are excited with said test signals. This involves the advantage that the controlled exciting of processing paths can be logically and flexibly added to the execution of a real-time operating system, with predictable and controllable effect on its operation.

According to an embodiment the method comprises performing said setting of the microelectronic circuit into said idle state by scheduling the running of an idle task, with a priority associated with said idle task being lower than the priorities associated with said other tasks, and performing said exciting of said one or more processing paths by running an excitation task associated with a priority higher than the priority of said idle task but lower than the priorities associated with said other tasks. This involves the advantage that the code for exciting the processing paths and the code for running the idle task can be kept separate from each other in creating, editing, and maintaining.

According to an embodiment said exciting of said one or more processing paths is preceded by issuing an interrupt disable instruction and succeeded by issuing an interrupt enable instruction. This involves the advantage that it can be ensured that interrupt handling will not interfere with exciting the processing paths, or vice versa.

According to an embodiment the occurrence of a specific instruction, such as a NOP (No Operation) instruction, or a specific set of instructions, is used as one of said one or more pieces of input information, so that said exciting of said one or more processing paths is performed during the execution of said specific instruction or said specific set of instructions. This involves the advantage that the exciting of said one or more processing paths can be made to controllably overlap with the execution of other instructions, however so that no interference is caused to other processing of data.

According to an embodiment the occurrence of a write operation that involves writing one or more digital values into a predefined register is used as one of said one or more pieces of input information, so that said exciting of said one or more processing paths is performed in response to the occurrence of such a write operation. This involves the advantage that the value or values that are written to said predefined register can be used to control the way in which the exciting is done.

According to an embodiment the occurrence of a machine-executable instruction that was automatically added to a compiled form of said real-time operating system by a compiler is used as one of said one or more pieces of input information, so that said exciting of said one or more processing paths is performed in response to the occurrence of such a machine-executable instruction. This involves the advantage that the instruction or instructions for performing the excitation can be made to have a standard form, without causing too much additional work for the person who writes the code of the operating system.

According to an embodiment the method comprises using said idle state to run housekeeping operations of said microelectronic circuit, such as de-fragmentation of freed system memory or erasing one or more flash memory blocks. This involves the advantage that the idle period can be at least partly utilized for useful purposes.

According to an embodiment the method comprises using said idle state to run non-core operations of the microelectronic circuit, such as on-chip or off-chip interconnect delay; other I/O delay; power control logic delay such as sleep modes; cache miss; integrated memory controllers delay; or other memory delay. This involves the advantage that the idle period can be at least partly utilized for useful purposes.

According to an embodiment the method comprises issuing a wait-for-interrupt instruction after said housekeeping operations have been performed, said wait-for-interrupt instruction suspending further execution of any tasks in said microelectronic circuit until a subsequent interrupt is received; and performing said exciting of said one or more processing paths after performing said housekeeping operations but before issuing said wait-for-interrupt instruction. This involves the advantage that the order of actions to be performed in the idle mode is well defined, and consequently the effect of such actions is deterministic in all situations.

According to an embodiment the method comprises—as a result of deciding that said one or more processing paths of the microelectronic circuit are to be excited with said test signals—checking whether those one or more processing paths that are to be excited already have data processing activity; and in response to finding that those one or more processing paths that are to be excited already have data processing activity, cancelling the decided exciting of those one or more processing paths with test signals and utilizing said data processing activity for monitoring whether timing events occur on those one or more processing paths. This involves the advantage that naturally occurring activity on the processing paths can be double used for detecting possible timing events, and redundant excitation of processing paths can be avoided.

According to an embodiment said proceeding to excite said one or more of said processing paths with said test signals is preceded by a check of whether sufficient time for performing said exciting will occur as a part of other operation of the microelectronic circuit within a maximum allowable delay. In response to said check indicating that sufficient time for performing said exciting will occur as a part of other operation of the microelectronic circuit within a maximum allowable delay, the method comprises waiting for said sufficient time to occur before proceeding to excite said one or more of said processing paths. In response to said check indicating that sufficient time for performing said exciting will not occur as a part of other operation of the microelectronic circuit within a maximum allowable delay, the method comprises forcibly changing said other operation of the microelectronic circuit in order to provide said sufficient time and thereafter proceeding to excite said one or more of said processing paths. This involves the advantage that the exciting of processing paths can be performed in time, while simultaneously avoiding disturbance to other processes that are running.

According to an embodiment the method comprises selecting at least one of a selected operating voltage level and a selected clock frequency on the basis of an oncoming instance of executing at least one task of said plurality of tasks; and performing said exciting of said one or more processing paths at the selected operating voltage level and/or clock frequency to make said exciting indicative of the capability of the microelectronic circuit to successfully execute the oncoming task. This involves the advantage that the sufficient performance of the microelectronic circuit for an oncoming task can be ensured in a flexible way, depending on the task in question.

According to a second aspect there is provided a microelectronic circuit, comprising a processing unit that comprises processing paths and is configured to provide one or more pieces of input information to a decision-making software; execute the decision-making software to decide, based on at least said one or more pieces of input information, whether one or more of said processing paths of the microelectronic circuit are to be excited with test signals; and— as a result of deciding that said one or more processing paths of the microelectronic circuit are to be excited with said test signals— proceed to excite said one or more of said processing paths with said test signals and monitoring whether timing events occur on such one or more excited processing paths. A timing event is a change in a digital value at an input of a respective register circuit on an excited processing path, which change took place later than an allowable time limit defined by a triggering signal to said respective register circuit.

According to an embodiment the microelectronic circuit is configured to execute a scheduler as a part of a real-time operating system running in said microelectronic circuit; schedule, through said executing of said scheduler, the running of a plurality of tasks in said microelectronic circuit in an order defined by priorities associated with said tasks; repetitively set, through said executing of said scheduler, the microelectronic circuit into an idle state for idle periods between consecutive periods of running said tasks; and use said setting into an idle state as one of said one or more pieces of input information, so that during one or more of said idle periods, one or more of said processing paths are excited with said test signals. This involves the advantage that the controlled exciting of processing paths can be logically and flexibly added to the execution of a real-time operating system, with predictable and controllable effect on its operation.

According to an embodiment the processing unit is configured to perform said setting of the microelectronic circuit into said idle state by scheduling the running of an idle task, with a priority associated with said idle task being lower than the priorities associated with said other tasks; and perform said exciting of said one or more processing paths by running an excitation task associated with a priority higher than the priority of said idle task but lower than the priorities associated with said other tasks. This involves the advantage that the code for exciting the processing paths and the code for running the idle task can be kept separate from each other in creating, editing, and maintaining.

According to an embodiment the processing unit is configured to issue an interrupt disable instruction before said exciting of said one or more processing paths and issuing an interrupt enable instruction after said exciting of said one or more processing paths. This involves the advantage that it can be ensured that interrupt handling will not interfere with exciting the processing paths, or vice versa.

According to an embodiment the processing unit is configured to use the occurrence of a specific instruction, such as a NOP (No Operation) instruction, or a specific set of instructions, as one of said one or more pieces of input information, so that said exciting of said one or more processing paths is performed during the execution of said specific instruction or said specific set of instructions. This involves the advantage that the exciting of said one or more processing paths can be made to controllably overlap with the execution of other instructions, however so that no interference is caused to other processing of data.

According to an embodiment the processing unit is configured to use the occurrence of a write operation that involves writing one or more digital values into a predefined register as one of said one or more pieces of input information, so that said exciting of said one or more processing paths is performed in response to the occurrence of such a write operation. This involves the advantage that the value or values that are written to said predefined register can be used to control the way in which the exciting is done.

According to an embodiment the processing unit is configured to use the occurrence of a machine-executable instruction that was automatically added to a compiled form of said real-time operating system by a compiler as one of said one or more pieces of input information, so that said exciting of said one or more processing paths is performed in response to the occurrence of such a machine-executable instruction. This involves the advantage that the instruction or instructions for performing the excitation can be made to have a standard form, without causing too much additional work for the person who writes the code of the operating system.

According to an embodiment the processing unit is configured to use said idle state to run housekeeping operations of said microelectronic circuit, such as de-fragmentation of freed system memory or erasing one or more flash memory blocks. This involves the advantage that the idle period can be at least partly utilized for useful purposes.

According to an embodiment the processing unit is configured to use said idle state to run non-core operations of the microelectronic circuit, such as on-chip or off-chip interconnect delay; other I/O delay; power control logic delay such as sleep modes; cache miss; integrated memory controllers delay; or other memory delay. This involves the advantage that the idle period can be at least partly utilized for useful purposes.

According to an embodiment the processing unit is configured to issue a wait-for-interrupt instruction after said housekeeping or non-core operations have been performed, said wait-for-interrupt instruction suspending further execution of any tasks in said microelectronic circuit until a subsequent interrupt is received, and perform said exciting of said one or more processing paths after performing said housekeeping or non-core operations but before issuing said wait-for-interrupt instruction. This involves the advantage that the order of actions to be performed in the idle mode is well defined, and consequently the effect of such actions is deterministic in all situations.

According to an embodiment the processing unit is configured to check, as a result of deciding that said one or more processing paths of the microelectronic circuit are to be excited with said test signals, whether those one or more processing paths that are to be excited already have data processing activity; and in response to finding that those one or more processing paths that are to be excited already have data processing activity, cancel the decided exciting of those one or more processing paths with test signals and utilizing said data processing activity for monitoring whether timing events occur on those one or more processing paths. This involves the advantage that naturally occurring activity on the processing paths can be double used for detecting possible timing events, and redundant excitation of processing paths can be avoided.

According to an embodiment the processing unit is configured to check, before exciting said one or more of said processing paths with said test signals, whether sufficient time for performing said exciting will occur as a part of other operation of the microelectronic circuit within a maximum allowable delay; wait, in response to said check indicating that sufficient time for performing said exciting will occur as a part of other operation of the microelectronic circuit within a maximum allowable delay, for said sufficient time to occur before proceeding to excite said one or more of said processing paths; and forcibly change, in response to said check indicating that sufficient time for performing said exciting will not occur as a part of other operation of the microelectronic circuit within a maximum allowable delay, said other operation of the microelectronic circuit in order to provide said sufficient time, and thereafter proceed to excite said one or more of said processing paths. This involves the advantage that the exciting of processing paths can be performed in time, while simultaneously avoiding disturbance to other processes that are running.

According to an embodiment the processing unit is configured to select at least one of a selected operating voltage level and a selected clock frequency on the basis of an oncoming instance of executing at least one task of said plurality of tasks; and perform said exciting of said one or more processing paths at the selected operating voltage level and/or clock frequency to make said exciting indicative of the capability of the microelectronic circuit to successfully execute the oncoming task. This involves the advantage that the sufficient performance of the microelectronic circuit for an oncoming task can be ensured in a flexible way, depending on the task in question.

According to a third aspect there is provided a computer program product, comprising one or more sets of one or more machine-executable instructions stored on a machine-readable medium, said instructions being configured to, when executed on one or more processors, cause the implementation of a method of the kind described above or later in this text.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
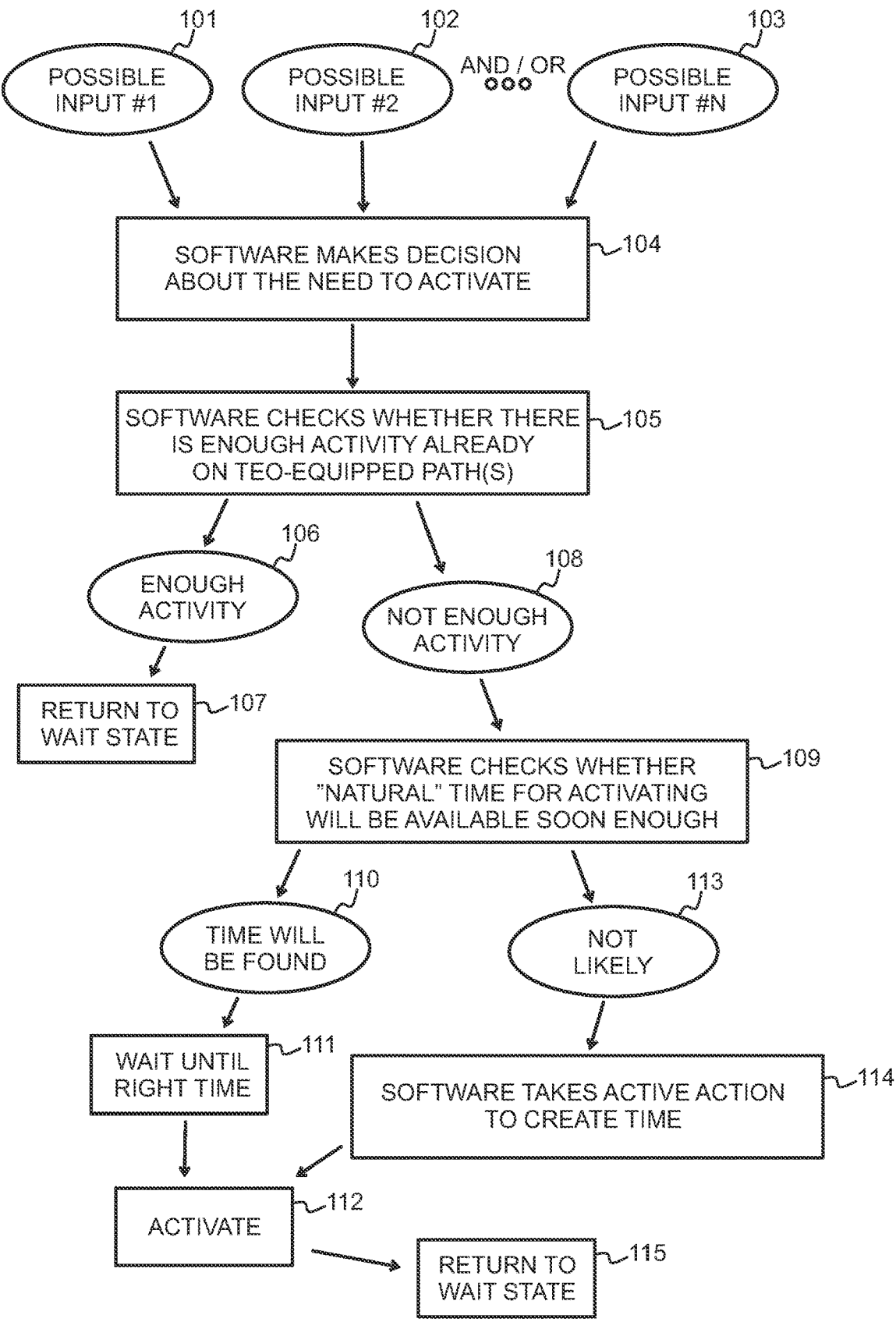
FIG. 1 illustrates a method.

FIG. 1 illustrates a method for organizing the excitation of processing paths in a microelectronic circuit. Alternatively or additionally FIG. 1 can be regarded as illustrating one or more set of one or more machine-readable instructions that, when executed on one or more processors, cause the execution of such a method.

As shown with reference designators 101, 102, and 103 there may be provided one or more pieces of input information to a decision-making software. A wide variety of different kinds of input information are possible. As a first example, the occurrence of a specific instruction, such as a NOP (No Operation) instruction, or a specific set of instructions, can be used as one of the one or more pieces of input information. In that case the exciting of one or more processing paths could be performed during the execution of the specific instruction or set of instructions, if the decision-making software decides to do so, as will be described later in more detail.

As a second example, the occurrence of a write operation that involves writing one or more digital values into a predefined register can be used as one of the one or more pieces of input information. In that case the exciting of the one or more processing paths could be performed in response to the occurrence of such a write operation, if the decision-making software decides to do so, as will be described later in more detail.

As a third example, the occurrence of a machine-executable instruction that was automatically added to a compiled form of a real-time operating system by a compiler could be used as one of said one or more pieces of input information. In that case the exciting of the one or more processing paths could be performed in response to the occurrence of such a machine-executable instruction, if the decision-making software decides to do so, as will be described later in more detail.

Step 104 in FIG. 1 involves executing the decision-making software to decide, based on at least the input information provided, whether one or more of the processing paths of the microelectronic circuit should be excited with test signals. A positive result, i.e. a decision that one or more processing paths of the microelectronic circuit are to be excited with said test signals, may eventually lead to step 112, which involves proceeding to excite one or more of said processing paths with test signals. It also involves monitoring whether timing events occur on such one or more excited processing paths. In this text a timing event means a change in a digital value at an input of a respective register circuit on an excited processing path, which change took place later than an allowable time limit defined by a triggering signal to said respective register circuit.

However, after making a preliminarily positive decision in step 104 the method may involve checking whether those one or more processing paths that are to be excited already have data processing activity, as shown with step 105. Reference designator 106 represents finding that those one or more processing paths that are to be excited already have data processing activity. This leads to cancelling the decided exciting of the one or more processing paths with test signals, and utilizing said data processing activity for monitoring whether timing events occur on those one or more processing paths. The decision-making algorithm may go back to its wait state as shown with reference designator 107 in FIG. 1.

An example of proceeding through steps 104-105-106-107 in this order could be one where the input information that first triggered the execution of the decision-making algorithm involved information about a detected change in temperature, while simultaneously there was a lot of processing going on. In general, achieving or crossing some threshold temperature of the microelectronic circuit may mean that timing events become more probable, due to the physical effects that temperature has on the propagation of signals on the processing paths. Particularly awkward would be a situation in which the temperature went far beyond the threshold during a period of low processing activity, so that with the resulting combination of operating voltage, clock frequency, and temperature the probability of timing events was unacceptably high: as soon as more payload data would appear for processing, multiple timing events could occur and cause problems. However, if there was a lot of processing going already when the threshold temperature was reached, the normal processing of payload data would already produce the timing events if any were to occur. The system would thus get an early warning that temperature was about to cause problems, and could react by e.g. increasing operating voltage and/or decelerating clock frequency to counteract for the effects of temperature.

Reference designator 108 indicates the alternative that there is not enough "native" or "payload" processing activity going on, so the system might be drifting towards a higher probability of timing events without getting a proper warning. The result will then be a decision to feed deliberate "test" or "dummy" signals into at least some selected delay-critical processing paths, and see whether their propagation through such delay-critical processing paths causes timing events. In the embodiment of FIG. 1 there is an additional check to be made: the check of whether sufficient time for performing said exciting will occur as a part of other operation of the microelectronic circuit within a maximum allowable delay. This check is shown as step 109 in FIG. 1, and its two possible results are illustrated with reference designators 110 and 113.

Reference designator 110 means that, according to said check, sufficient time for performing said exciting will occur as a part of other operation of the microelectronic circuit within a maximum allowable delay. For example, the check may show that a scheduler of a real-time operating system of the microelectronic circuit is currently aware of only a small number of tasks that are waiting to be executed, after which there may occur an idle period. As a result, the method proceeds to waiting for said sufficient time to occur at step 111, before proceeding to excite the one or more processing paths in question at step 112. If, on the other hand, said check indicated that sufficient time for performing said exciting is not likely to occur as a part of other operation of the microelectronic circuit within a maximum allowable delay, as in step 113, the method proceeds to forcibly changing said other operation of the microelectronic circuit in order to provide said sufficient time at step 114 and thereafter proceeding to exciting said one or more processing paths at step 112.

Figure 2:
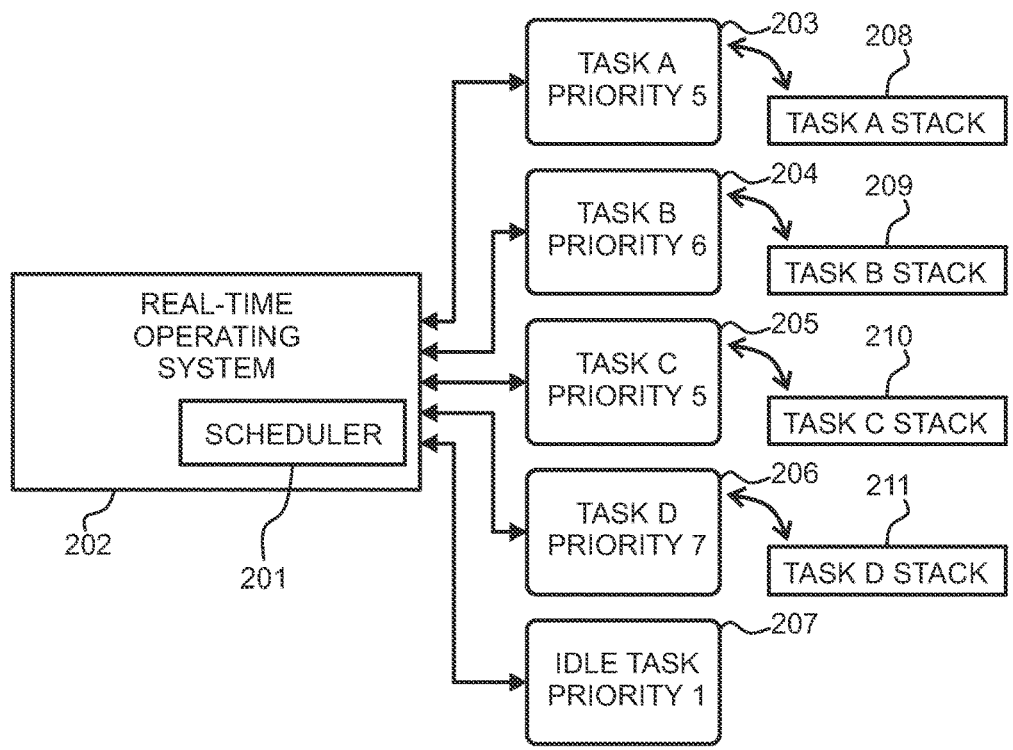
FIG. 2 illustrates a real-time operating system with a scheduler and a number of tasks.

FIG. 2 illustrates a case in which a scheduler 201 is executed as a part of a real-time operating system 202 running in a microelectronic circuit. The purpose of executing the scheduler 201 is to enable scheduling the running of a plurality of tasks 203, 204, 205, 206, and 207 in the microelectronic circuit. Scheduling involves deciding, which task will be running at which time instant. Running the scheduler may be triggered by various events, such as operating system calls, external interrupts, or the expiry of the so-called system tick for example. The system tick is an internal hardware interrupt of the microelectronic circuit, and the length of its expiry time defines the shortest possible delay after the duration of which a task may request to be waked up.

Each task is associated with a corresponding priority, and they are scheduled to run in an order defined by their associated priorities. FIG. 2 conforms to the common practice of expressing higher priority with a larger number, so that of the five tasks shown as examples in FIG. 2 task D has the highest priority, followed by task B, then tasks A and C with equal priorities, and finally the idle task 207 that has the lowest priority. For each of the tasks A to D there exists an associated, task-specific stack 208, 209, 210, or 211 of stored information that the microelectronic circuit can manipulate while executing the instructions of the task that is running. For the duration when a task is not running is most recent state is stored in the stack, from which it can be returned when the task begins running the next time.

A real-time operating system will typically not spend all, or even any large majority of, its time running the actual tasks. Rather, through executing the scheduler 201 the microelectronic circuit is repetitively set into an idle state. The idle periods thus come between consecutive periods of running the tasks. Setting the microelectronic circuit to the idle state may be described as running an idle task 207, the priority of which is lower than the priority of any of the actual tasks. While the idle periods represent lower activity than the tasks, they may still involve more than just waiting. The idle state can be used to run housekeeping operations of the microelectronic circuit, like de-fragmentation of freed system memory, erasing one or more flash memory blocks, or the like, by implementing the idle task 207 as code that causes the execution of such housekeeping operations.

Figure 3:
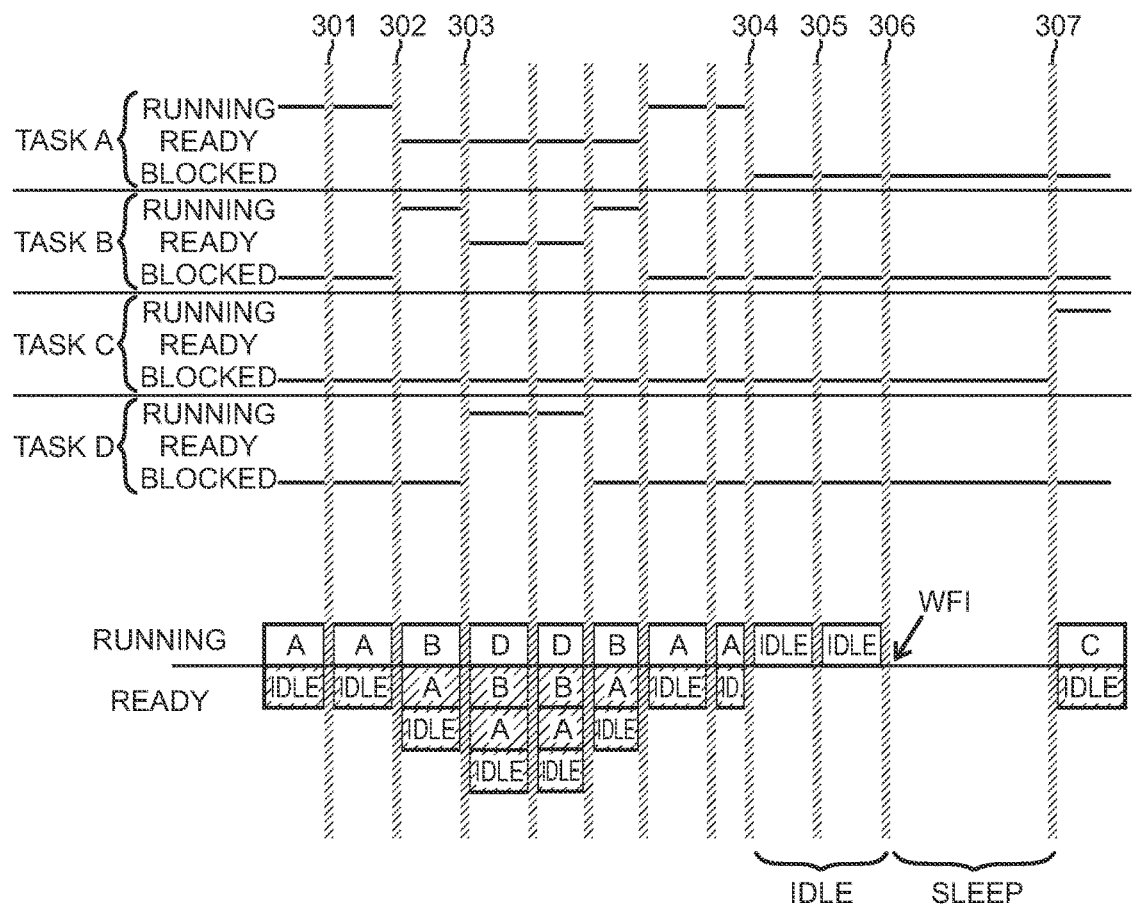
FIG. 3 illustrates the use of a scheduler to arrange the running of tasks and an idle period.

The intervals between consecutive periods of running the tasks may involve various levels of reduced activity, of which the concepts of idle mode and sleep mode are given here as examples with reference to FIG. 3. In FIG. 3 it is assumed, much like in FIG. 2 above, that a scheduler is executed as a part of a real-time operating system. Through executing said scheduler the running of a plurality of tasks is scheduled in an order defined by priorities associated with said tasks. Time instants of running the scheduler or at least a part of it are illustrated as vertical hatched lines in FIG. 3.

Next to the name of each task A, B, C, or D, its state is shown as a line diagram: the task in question may be running, ready, or blocked. Only one task can be running at a time in the microelectronic circuit that is considered. When a task is not running it may be either ready or blocked. A task that is ready has placed a request to get running, but is currently "pre-empted" by a higher-priority task that is running. The term "blocked" is the commonly used designation for a task that is currently neither running nor requesting to run; the term must be understood widely so that it does not require that some external obstruction would keep the task from running. A task may become blocked for example so that after finishing a current round of executing it goes into a state of inactivity and sets a wake-up timer, at the expiry of which it needs to be run for the next time. Another commonly used characterization of the blocked state is that the task in question has placed a request for a resource that is not available. In a way, the wake-up timer can be considered such a resource, because the resource it represents (the time to wake up) is not available before the wake-up timer expires.

In the lower part of FIG. 3 a task in a white rectangle above the horizontal divider line is running, while task(s) in hatched rectangle(s) below the line are waiting, in a mutual order defined by their priorities. At first, task A is running. Running the scheduler at point 301 does not reveal any higher-priority task that would be ready, to task A continues to run. Running the scheduler at point 302 results in finding a request for task B to run. Assuming that the priorities of the tasks are like in FIG. 2, task B has higher priority than task A, so it is scheduled to run while task A goes into waiting in the ready state. Running the scheduler at point 303 results in finding a request for the highest-priority task D to run, which causes also task B to be put into waiting in the ready state, and so on.

Running the scheduler at point 304 is triggered by task A finishing whatever it was doing and going blocked, for example so that it starts a wake-up timer of its own. As there are no other tasks requesting to run than the idle task, the microelectronic circuit is set to the idle state. At point 305 the same repeats, and the idle state continues. At point 306 executing the code of the idle task causes issuing a WFI (wait-for-interrupt) instruction, possibly after any housekeeping operations belonging to the idle task have been performed. The WFI instruction suspends further execution of any tasks in the microelectronic circuit until a subsequent interrupt is received. Such an interrupt may be an external interrupt or an internal one such as the system tick. The state of inactivity that is deeper than the idle mode can be called a sleep mode, and it continues until the subsequent interrupt causes running the scheduler at point 307, which in FIG. 3 results in finding a request to make task C run.

Figure 4:
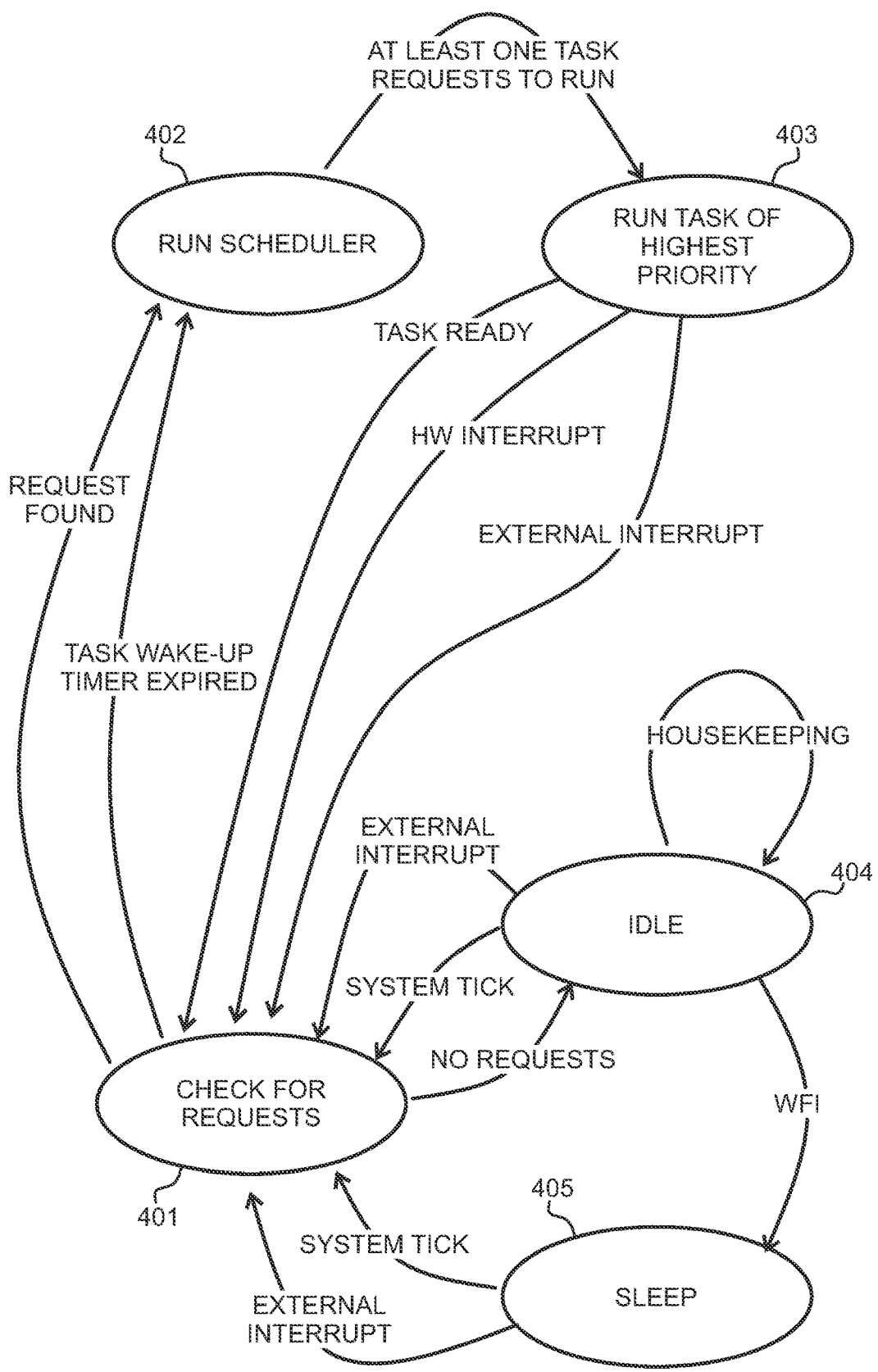
FIG. 4 illustrates a method in the form of a state diagram.

FIG. 4 illustrates an example of executing a method of the kind described above in the form of a state diagram. States 401 and 402 together correspond to running the scheduler; here it is assumed that the scheduler can be run in a condensed mode, represented by state 401, in which only the appearance of requests is checked for, or in extended mode, represented by state 402, in which the requesting task of highest priority is selected for running. For clarity, in FIG. 4 the idle task is not considered a task in proper sense, so the transition from state 402 to state 403 only takes place if in state 402 the scheduler finds a request to run placed by any "true" task.

Returning from state 403 to state 402 may take place for a number of reasons, some examples of which are given in FIG. 4. The running task may become ready, which it may signal for example by setting its corresponding wake-up timer. Also an external or internal interrupt may cause the transition.

If no requests from "true" tasks are found in state 402, a transition to the idle state 404 occurs. Housekeeping operations may be performed, but they do not cause any state transitions. An external interrupt or an internal interrupt such as the system tick may cause a transition to state 401, but if no requests are found a transition back to the idle state 404 occurs. A wait-for-instruction (WFI) may cause a transition from the idle state 404 to the sleep state 405. An external interrupt or an internal interrupt such as the system tick may cause a transition to state 401.

During one or more of the idle periods, represented in FIG. 4 by the time spent in the idle state 404, the method may comprise exciting one or more processing paths in the microelectronic circuit and monitoring whether timing events occur on such one or more excited processing paths. A timing event is a change in a digital value at an input of a respective register circuit on an excited processing path, which change took place later than an allowable time limit defined by a triggering signal to said respective register circuit. Using the idle period(s) for timing event detection involves a number of advantages. First, since the idle periods are, by definition, periods when no true tasks are running, exciting processing paths for the purpose of detecting timing events does not steal time from— or otherwise interfere with the execution of— any such true task. Second, since manipulating the stack of a task is only allowed while the task itself is running, the "superfluous" data values that are used to detect timing events do not get mixed up with actual data handled by the tasks.

Figure 5:
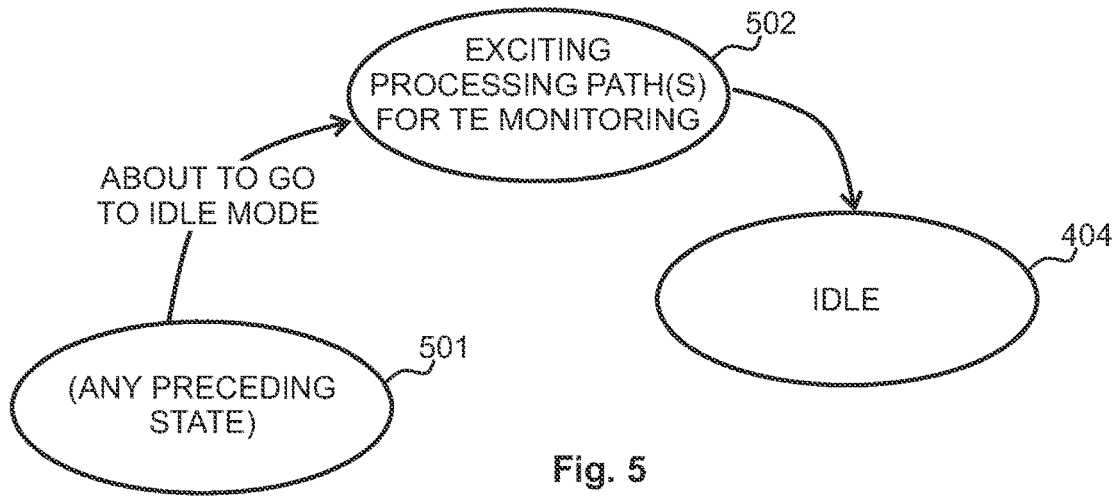
FIG. 5 illustrates an alternative implementation aspect of a method.

In case the idle state involves running an idle task that implements housekeeping functions for example, the ordering in time of such housekeeping functions and possible excitation of processing paths for timing event detection must be done so that these do not interfere with each other. An embodiment may also be presented in which performing the exciting of one or more processing paths for timing event detection is done as a task of its own. It can be done by running an excitation task associated with a priority higher than the priority of the idle task but lower than the priorities associated with other tasks. This is schematically shown in FIG. 5, where a transition from any preceding state 501 to the idle state 404 goes through a timing event detection state 502. Another possibility would be to combine states 502 and 404, so that the code that implements the exciting of the processing paths for timing event detection (state 502 in FIG. 5) is written as a part of the code that implements other functions that are to be performed as parts of the idle task (state 404).

Figure 6:
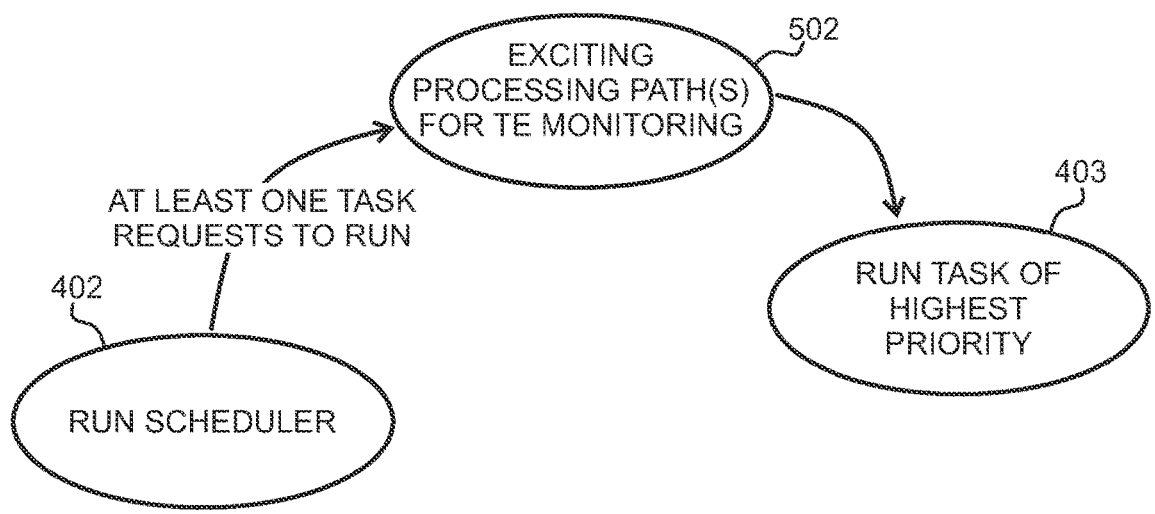
FIG. 6 illustrates an alternative implementation aspect of a method.

Another possible embodiment is shown in FIG. 6. This embodiment is particularly suitable if it is known that not all tasks require the same level of maximum performance of the microelectronic circuit. An operating voltage level and/or a clock frequency may be selected on the basis of an oncoming instance of executing at least one task, the task-specific performance requirements may be known. As an example, running the scheduler at state 402 might show that there is only one task that request running, and this task is one for which a relatively low clock frequency is sufficient. The microelectronic circuit or some controlling entity thereof may select a combination of a lowered operating voltage and a lowered clock frequency that are believed to be suitable for that particular task. After that, at state 502 in FIG. 6, the exciting of one or more processing paths may be made using the selected operating voltage level and/or clock frequency, to make said exciting indicative of the capability of the microelectronic circuit to successfully execute the oncoming task.

One possibility for timing the exciting of the one or more processing paths for performing timing event detection is to make it happen during a specific instruction, such as a NOP (No Operation) instruction, or some specific set or plurality of instructions. A NOP is a kind of an "empty" instruction, during the execution of which no actual processing of data takes place. In a way the time that is spent executing a NOP instruction is wasted, although the use of NOP instructions is justified for example in order to achieve a certain timing purpose, to force memory alignment, to prevent a hazard, to occupy a branch delay slot, to render void an existing instruction, or as a placeholder for active instructions that may be added later. Overlapping the excitation of processing paths for TEO purposes with the execution of NOP or corresponding "empty" instructions is a way of taking the otherwise "wasted" time into an even better use.

One possibility for timing the exciting of the one or more processing paths for performing timing event detection is to make it happen during a hardware-related delay such as on-chip or off-chip interconnect delay; other I/O delay; power control logic delay such as sleep modes; cache miss; integrated memory controllers delay; or other memory delay. More generally, a hardware-related delay is any interval of time during which the processor must wait for data for a reason that is based on hardware-posed constraints. Common cases are for example waiting for the I/O and memory (especially in the case of a cache miss). In some cases, the control of I/O and/or memory is offloaded to a separate controller freeing the processor to execute other instructions if such are available. In other cases, the processor will poll the I/O and/or memory with cyclic intervals. In both cases, free execution time for e.g. exciting one or more processing paths for performing timing event detection can be available, if data is not readily available.

A processor can also include a power management controller that can monitor key parameters to ensure that the processor stays within specifications for example for maximum power (or energy), current and temperature. The controller can try to minimize any of these variables or react when any one parameter is approaching its limit. Further, this control can be in the operating system, for example with predefined power and/or performance states. The control of variables such as those above is achieved by changing the processor's operating frequency and/or voltage. Due to the imperfections in the physical realizations of the processor's voltage and/or frequency generation, changes cannot happen arbitrarily fast. Additionally, any changes near the limits or within the predefined margin of the monitored variables may require checking whether the processor can still achieve the incoming operating point.

One possibility that concerns the initiation of the excitation of processing paths for TEO purposes is to trigger the exciting of said one or more processing paths with a write operation that involves writing one or more digital values into a predefined register. If the register has more than one bit, the value or values that are written to said predefined register can be used to control the way in which the exciting is done.

One possibility of producing the machine-executable instructions that cause the exciting of one or more processing paths for TEO purposes is to use a so-called compiler pragma. Many compilers involve the possibility of making the compiler automatically add certain machine-executable instructions to a compiled form of a program, such as a real-time operating system, at the time of doing the compiling. In other words, the person who writes the code of the operating system does not need to manually add the complete code for the TEO excitation mechanism; it suffices to add one line to the code that at the time of compiling instructs the compiler to add a standard form of a set of instructions.

Figure 7:
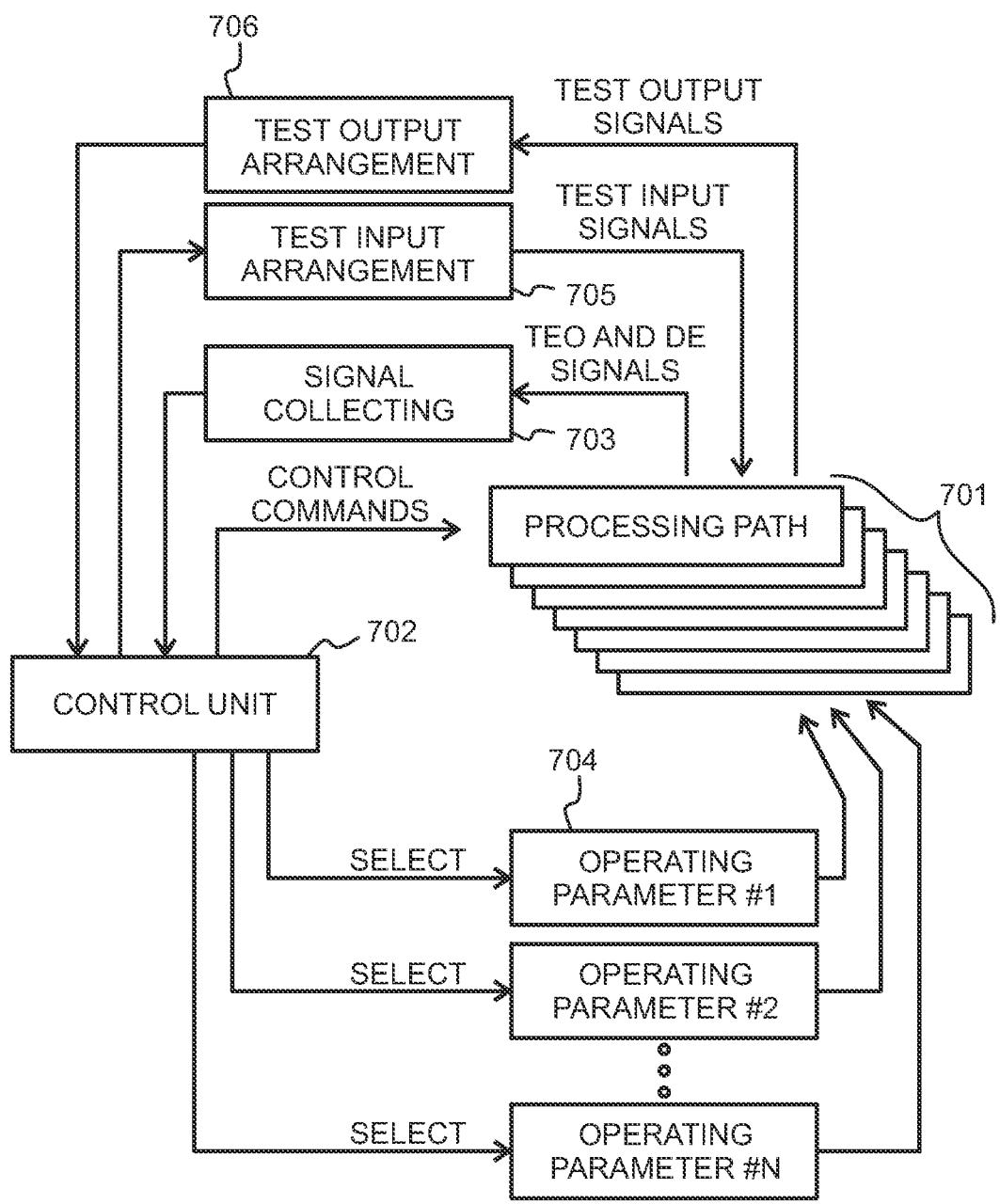
FIG. 7 illustrates parts of a microelectronic circuit.

FIG. 7 illustrates schematically a microelectronic circuit that comprises a plurality of processing paths 701 and a control unit 702. One or more of the processing paths 701 may be assumed to be delay-critical or otherwise such that it is advantageous to use them for excitation, and consequently equipped with register circuits capable of time borrowing and timing event detection, and also equipped with one or more controllable data event injection points for exciting said processing path(s) as needed. The control unit 702 may excite any desired processing path 701 by giving the appropriate control commands. Advantageously it is also the control unit 702 that is responsible for executing the scheduler mentioned above. One or more signal collecting circuits 703 are provided for collecting indicator signals, such as TEO (Timing Event Observation) signals, and for providing information about them to the control unit 702.

At least part of the microelectronic circuit of FIG. 7 consists of adaptive circuit elements, the performance of which is configurable by making one or more operating parameters of the microelectronic circuit each assume a respective operating parameter value. Examples of operating parameters of this kind are an operating voltage, a frequency of a triggering signal, and a length of a timing event detection window. The selection of operating parameter values is schematically shown in FIG. 7 with the operating parameter blocks, of which block 704 is an example.

For example a register circuit may be made an adaptive register circuit by ensuring that its performance is configurable by making one or more operating parameters of the register circuit each assume a respective operating parameter value. As such, a circuit element does not need to be adaptive in order to be included in an adaptive system or microelectronic circuit. An example could be an adaptive system or microelectronic circuit the supply voltage and/or energy consumption level and/or other parameter may be set from outside, while the internal circuit remains fixed and cannot be further configured: for example a monitoring window length may be fixed and not allowed to change.

The control unit 702 of an adaptive microelectronic circuit is configured to select values for operating parameters based on results of performance measurements that it obtained from parts of the microelectronic circuit. Said results of performance measurements may for example indicate the number of detected timing events per unit time, collected through one or more signal-collecting circuits 703.

The control unit 702 may be configured to lower an operating voltage value as a response to the results mentioned above indicating a level of detected timing events that is below a first threshold. In order to avoid situations where the low number of detected timing events was due to low or non-existent activity on a processing path, the control unit 702 may be configured to excite one or more such processing paths.

The DFT (Designed For Testability) capability of the microelectronic circuit of FIG. 7 is seen as the provision of a test input arrangement 705 and a test output arrangement 706. The test input arrangement 705 makes it possible to selectively feed in test signals to the circuit elements of the processing paths 701, and the test output arrangement 706 enables selectively collecting test output signals from the circuit elements of the processing paths 701. An example of using test input signals and test output signals, and the associated control commands that the control unit 702 may use to selectively set the circuit elements in the processing paths 701 into test mode.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A method for organizing excitation of processing paths in a microelectronic circuit, the method comprising:
    determining, within said microelectronic circuit based on at least one or more inputs, whether one or more of said processing paths of the microelectronic circuit are to be excited with test signals, and
    in response to determining that said one or more processing paths of the microelectronic circuit are to be excited with said test signals,
        proceeding to excite said one or more of said processing paths with said test signals; and
        monitoring whether timing events occur on said one or more excited processing paths; wherein a timing event is a change in a digital value at an input of a respective register circuit on an excited processing path, which change took place later than an allowable time limit defined by a triggering signal sent to said respective register circuit.

2. The method of claim 1, comprising:
    executing a scheduler as a part of a real-time operating system running in said microelectronic circuit;
    scheduling, through said executing of said scheduler, the running of a plurality of tasks in said microelectronic circuit in an order defined by priorities associated with said tasks;
    repetitively setting, through said executing of said scheduler, the microelectronic circuit into an idle state for idle periods between consecutive periods of running said tasks; and
    using said setting into the idle state as one of said one or more inputs, such that during one or more of said idle periods, one or more of said processing paths are excited with said test signals.

3. The method of claim 2, comprising:
    performing said setting of the microelectronic circuit into said idle state by scheduling the running of an idle task, with a priority associated with said idle task being lower than priorities associated with said other tasks; and
    performing said exciting of said one or more processing paths by running an excitation task associated with a priority higher than the priority of said idle task but lower than the priorities associated with said tasks.

4. The method of claim 2, wherein said exciting of said one or more processing paths is preceded by issuing an interrupt disable instruction and succeeded by issuing an interrupt enable instruction.

5. The method of claim 2, wherein an occurrence of a write operation that involves writing one or more digital values into a predefined register is used as one of said one or more inputs, such that said exciting of said one or more processing paths is performed in response to the occurrence of the write operation.

6. The method of claim 5, wherein an occurrence of a machine-executable instruction that was automatically added to a compiled form of said real-time operating system by a compiler is used as one of said one or more inputs, such that said exciting of said one or more processing paths is performed in response to the occurrence of the machine-executable instruction.

7. The method of claim 2, further comprising:
    selecting at least one of a selected operating voltage level and a selected clock frequency based on an oncoming instance of executing at least one task of said plurality of tasks; and performing said exciting of said one or more processing paths at the at least one of the selected operating voltage level and the clock frequency to make said exciting indicative of a capability of the microelectronic circuit to successfully execute the oncoming instance of the at least one task.

8. The method of claim 1, wherein an occurrence of at least one instruction is used as one of said one or more inputs, such that said exciting of said one or more processing paths is performed during the execution of the at least one instruction.

9. The method of claim 1, further comprising:
in response to determining that said one or more processing paths of the microelectronic circuit are to be excited with said test signals, checking whether those one or more processing paths that are to be excited already have data processing activity; and
in response to finding that those one or more processing paths that are to be excited already have data processing activity,
cancelling proceeding to excite those one or more processing paths with test signals; and
utilizing said data processing activity for monitoring whether timing events occur on those one or more processing paths.

10. The method of claim 1, wherein said proceeding to excite said one or more of said processing paths with said test signals is preceded by a check of whether sufficient time for performing said exciting will occur as a part of other operation of the microelectronic circuit within a maximum allowable delay, such that
in response to said check indicating that sufficient time for performing said exciting will occur as a part of other operation of the microelectronic circuit within a maximum allowable delay, waiting for said sufficient time to occur before proceeding to excite said one or more of said processing paths; and
in response to said check indicating that sufficient time for performing said exciting will not occur as a part of other operation of the microelectronic circuit within a maximum allowable delay, forcibly changing said other operation of the microelectronic circuit in order to provide said sufficient time and thereafter proceeding to excite said one or more of said processing paths.

11. A microelectronic circuit, comprising:
a processing unit that comprises processing paths, wherein the processing unit is configured to,
determine, based on at least one or more pieces of input information, whether one or more of said processing paths of the microelectronic circuit are to be excited with test signals; and
in response to a determination that said one or more processing paths of the microelectronic circuit are to be excited with said test signals, proceed to excite said one or more of said processing paths with said test signals and monitoring whether timing events occur on such one or more excited processing paths;
wherein a timing event is a change in a digital value at an input of a respective register circuit on an excited processing path, which change took place later than an allowable time limit defined by a triggering signal to said respective register circuit.

12. The microelectronic circuit of claim 11, wherein the processing unit is configured to:
execute a scheduler as a part of a real-time operating system running in said microelectronic circuit;
schedule, through said executing of said scheduler, the running of a plurality of tasks in said microelectronic circuit in an order defined by priorities associated with said tasks; and
repetitively set, through said executing of said scheduler, the microelectronic circuit into an idle state for idle periods between consecutive periods of running said tasks; and
use said setting into an idle state as one of said one or more pieces of input information, such that during one or more of said idle periods, one or more of said processing paths are excited with said test signals.

13. The microelectronic circuit of claim 12, wherein the processing unit is configured to:
perform said setting of the microelectronic circuit into said idle state by scheduling the running of an idle task, with a priority associated with said idle task being lower than the priorities associated with said other tasks; and
perform said exciting of said one or more processing paths by running an excitation task associated with a priority higher than the priority of said idle task but lower than the priorities associated with said other tasks.

14. The microelectronic circuit of claim 12, wherein the processing unit is configured to issue an interrupt disable instruction before said exciting of said one or more processing paths and issuing an interrupt enable instruction after said exciting of said one or more processing paths.

15. The microelectronic circuit of claim 12, wherein the processing unit is configured to use an occurrence of a machine-executable instruction that was automatically added to a compiled form of said real-time operating system by a compiler as one of said one or more pieces of input information, such that said exciting of said one or more processing paths is performed in response to the occurrence of the machine-executable instruction.

16. The microelectronic circuit of claim 12, wherein the processing unit is configured to:
select at least one of a selected operating voltage level and a selected clock frequency based on an oncoming instance of executing at least one task of said plurality of tasks; and
perform said exciting of said one or more processing paths at the at least one selected operating voltage level and the selected clock frequency to make said exciting indicative of a capability of the microelectronic circuit to successfully execute the oncoming instance of the at least one task.

17. The microelectronic circuit of claim 11, wherein the processing unit is configured to use an occurrence of at least one instruction as one of said one or more pieces of input information, such that said exciting of said one or more processing paths is performed during the execution of the at least one instruction.

18. The microelectronic circuit of claim 11, wherein the processing unit is configured to use an occurrence of a write operation that involves writing one or more digital values into a predefined register as one of said one or more pieces of input information, such that said exciting of said one or more processing paths is performed in response to the occurrence of the write operation.

19. The microelectronic circuit of claim 11, wherein said processing unit is configured to:
check, before exciting said one or more of said processing paths with said test signals, whether sufficient time for performing said exciting will occur as a part of other operation of the microelectronic circuit within a maximum allowable delay;

wait, in response to said check indicating that sufficient time for performing said exciting will occur as a part of other operation of the microelectronic circuit within a maximum allowable delay, for said sufficient time to occur before proceeding to excite said one or more of said processing paths; and forcibly change, in response to said check indicating that sufficient time for performing said exciting will not occur as a part of other operation of the microelectronic circuit within a maximum allowable delay, said other operation of the microelectronic circuit in order to provide said sufficient time, and thereafter proceed to excite said one or more of said processing paths.

20. A non-transitory computer-readable medium comprising instructions that are executable by a processor to perform operations comprising:

determining, within a microelectronic circuit based on at least one or more inputs, whether one or more of processing paths of the microelectronic circuit are to be excited with test signals, and in response to determining that said one or more processing paths of the microelectronic circuit are to be excited with said test signals, proceeding to excite said one or more of said processing paths with said test signals; and monitoring whether timing events occur on such one or more excited processing paths; wherein a timing event is a change in a digital value at an input of a respective register circuit on an excited processing path, which change took place later than an allowable time limit defined by a triggering signal to said respective register circuit.

* * * * *